United States Patent [19]

Ansel et al.

[11] Patent Number: 5,714,808
[45] Date of Patent: Feb. 3, 1998

[54] TOUCH CONTROL SUPPLY SYSTEM FOR AN ELECTRICAL DEVICE, METHOD OF IMPLEMENTATION AND APPLICATIONS

[75] Inventors: Daniel Ansel, Toulouse; Christian Neri, Pibrac, both of France

[73] Assignee: Tactilis, Empeaux, France

[21] Appl. No.: 501,049

[22] PCT Filed: Feb. 9, 1994

[86] PCT No.: PCT/FR94/00150

§ 371 Date: Aug. 18, 1995

§ 102(e) Date: Aug. 18, 1995

[87] PCT Pub. No.: WO94/19918

PCT Pub. Date: Sep. 1, 1994

[30] Foreign Application Priority Data

Feb. 18, 1993 [FR] France .................. 93 01881

[51] Int. Cl.[6] .................. H05B 39/08
[52] U.S. Cl. .................. 307/116; 307/112; 307/157; 315/362; 323/904; 327/517
[58] Field of Search .................. 307/116, 112, 307/157; 315/362; 323/904; 327/517; 200/52 R

[56] References Cited

U.S. PATENT DOCUMENTS

| Re. 33,285 | 7/1990 | Kunen | 307/116 |
| 3,641,410 | 2/1972 | Vogelsberg | 388/830 |
| 4,507,716 | 3/1985 | Benedict, Jr. | 362/295 |
| 4,723,080 | 2/1988 | Cline et al. | 307/116 |
| 4,764,708 | 8/1988 | Roudeski | 315/51 |
| 4,878,107 | 10/1989 | Hopper | 257/415 |
| 5,166,482 | 11/1992 | Li | 200/52 R |

FOREIGN PATENT DOCUMENTS

| 2641105 | 3/1978 | Germany . |
| 3620984 | 3/1987 | Germany . |
| 2249378 | 5/1992 | United Kingdom . |
| 8807291 | 9/1988 | WIPO . |

*Primary Examiner*—Richard T. Elms
*Assistant Examiner*—Albert W. Paladini
*Attorney, Agent, or Firm*—Greenblum & Bernstein, P.L.C.

[57] ABSTRACT

A system for supplying at least one electrical apparatus with a touch control. The system may be utilized in a home automation system for supplying electrical equipment, e.g., light bulbs, motors, strip lights, electrical power points, etc., or may be utilized to form part of equipment, e.g., a lamp, lamp stand, etc. The system may include treated zones formed by chemical treatment of an electrically insulating support material to provide the zones with a reduced electrical impedance to allow leakage current flow. The treated zones may be electrically coupled to a detection input of an electrical control circuit to allow the leakage current to be detected by the detection input and enable the electrical control circuit to control a switch in accordance with the leakage currents, which are generated in the treated zone when a user touches the treated zone.

26 Claims, 4 Drawing Sheets

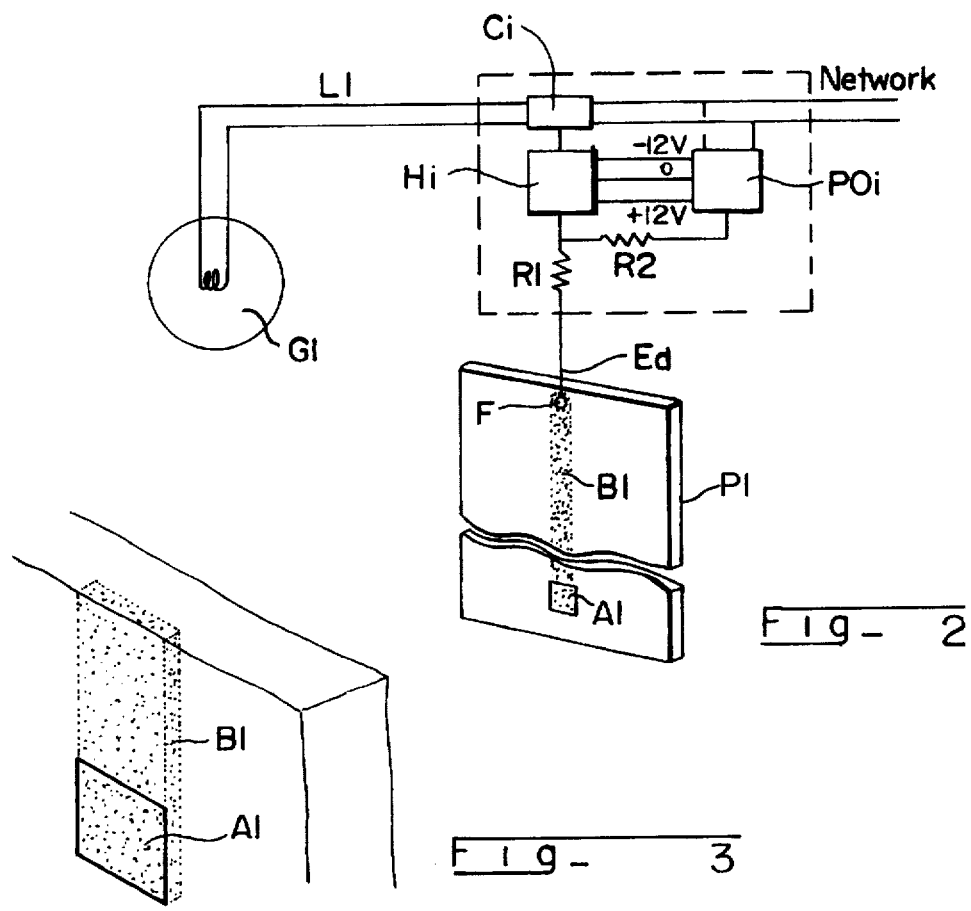
Fig-2
Fig-3
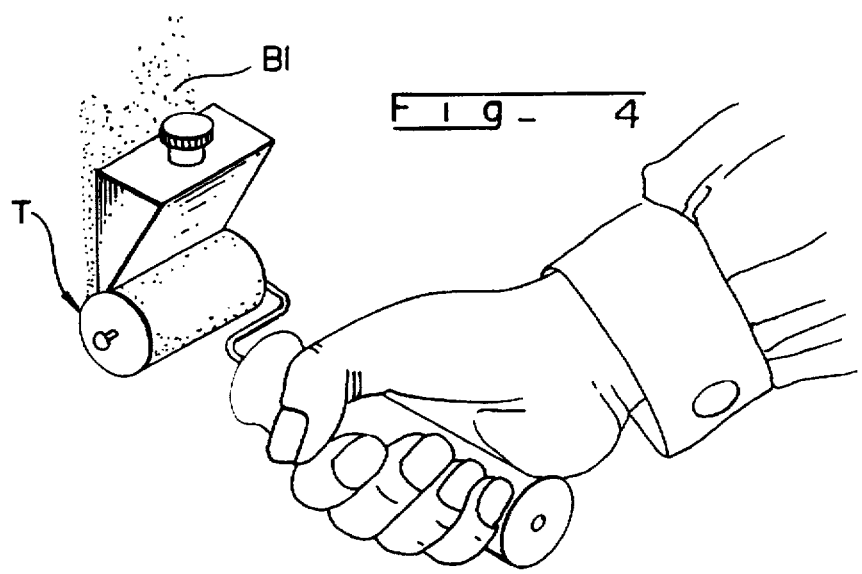
Fig-4

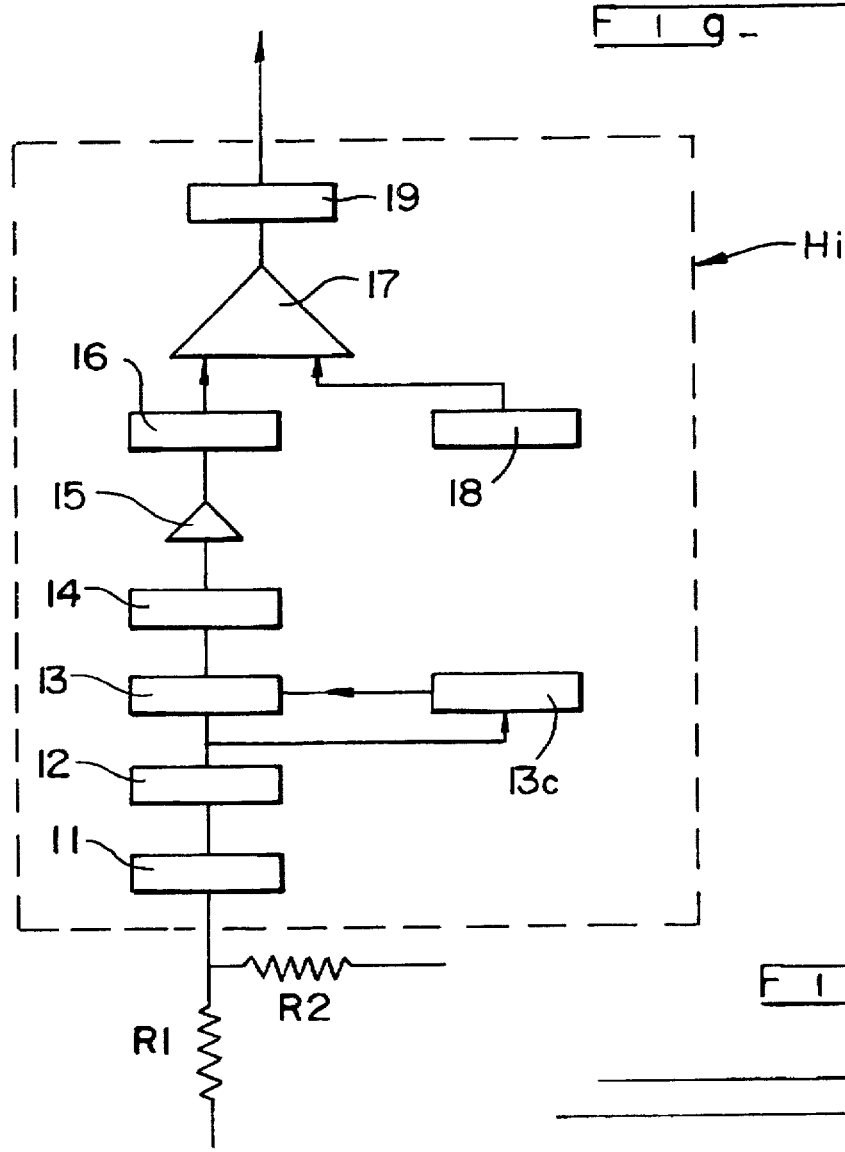
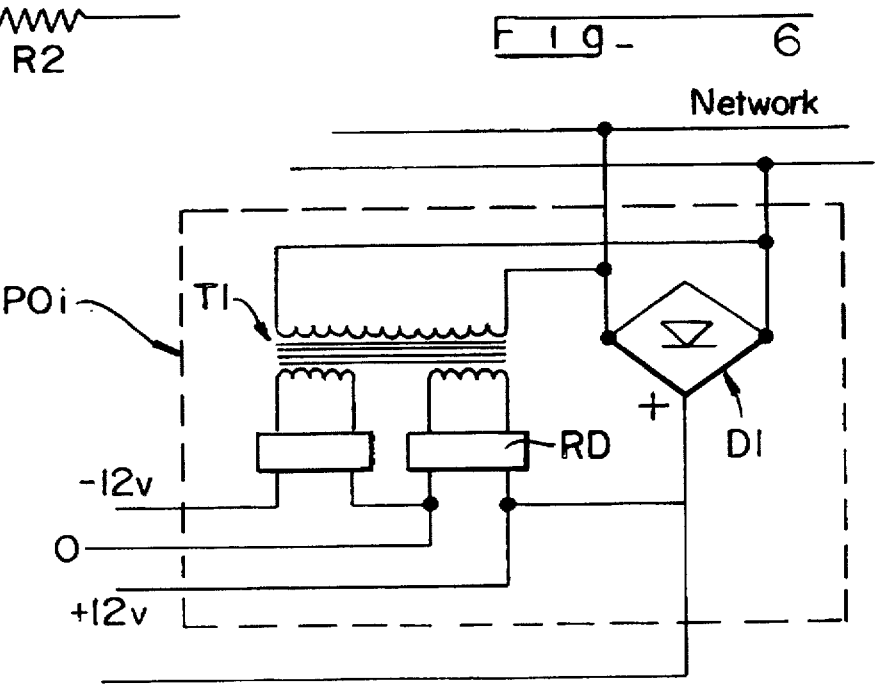

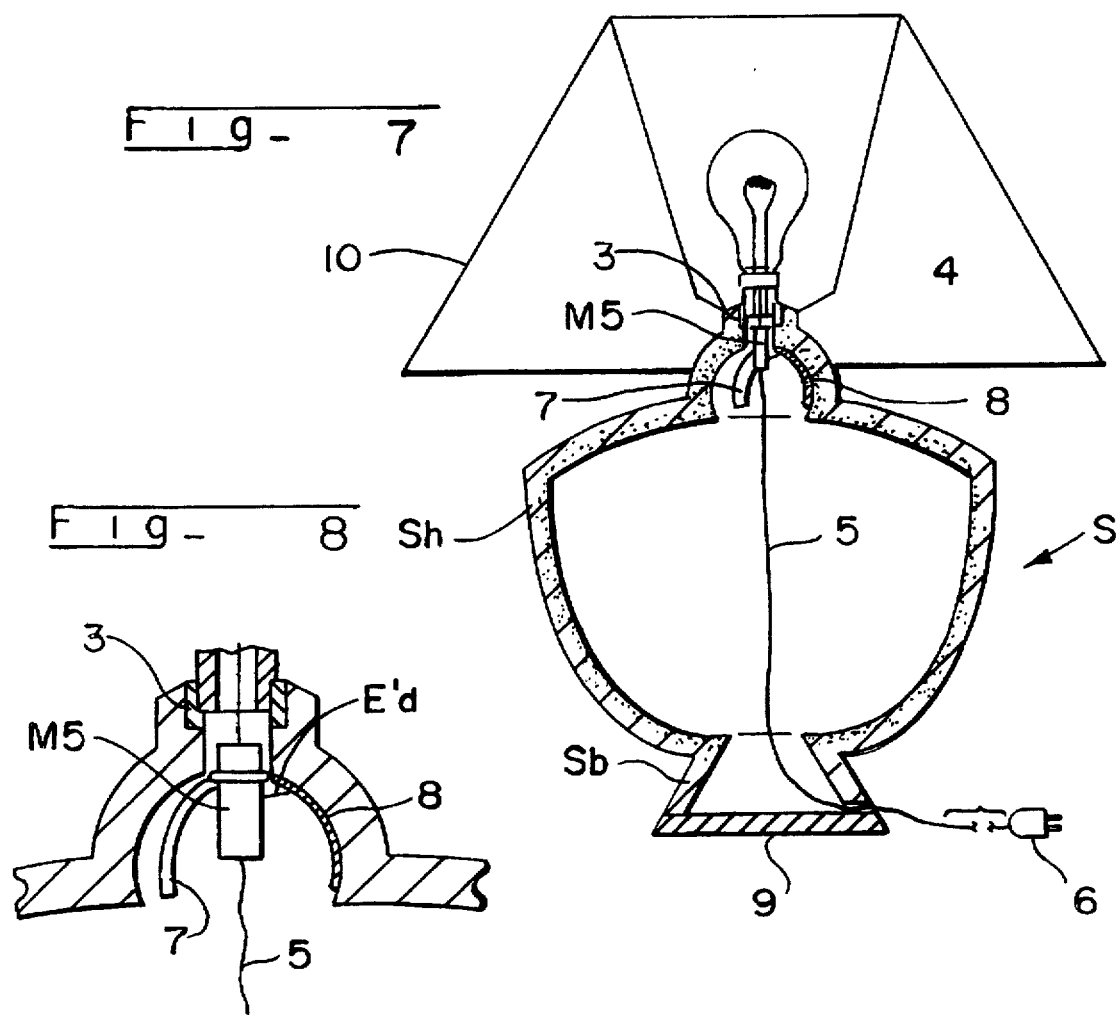
Fig. 7
Fig. 8
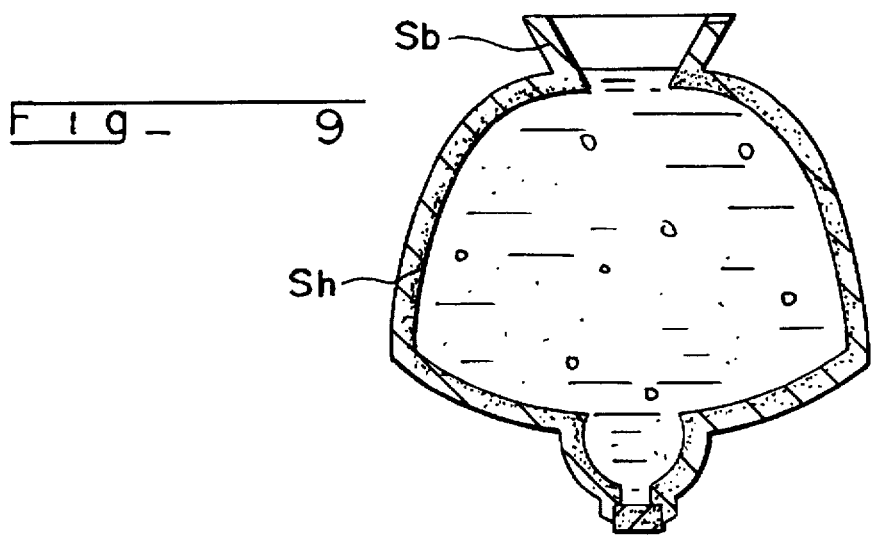
Fig. 9

TOUCH CONTROL SUPPLY SYSTEM FOR AN ELECTRICAL DEVICE, METHOD OF IMPLEMENTATION AND APPLICATIONS

CROSS REFERENCE TO RELATED APPLICATION

The present application claims priority under 35 U.S.C. §119 of French Patent Application No. 93/01881, filed Feb. 18, 1993.

BACKGROUND OF THE INVENTION

1. Field of the Invention

The invention relates to a process of implementing a system for feeding an electrical unit such as a lighting unit, electrical outlet, relay, electromechanical switch, contactor, electric motor, etc., making it possible to control by touch the powering up or powering down of the said unit and, where necessary, causing variations of intensity of the feed current thereto. The invention extends to installations thus manufactured as well as to preferred applications particularly in the field of home automation or that of the manufacture of lamps and light fittings.

2. Discussion of Background Information

Electronic apparatus which make it possible to control a lighting element by simple touch of a sensitive conductor element are known. For example, U.S. Pat. No. 4,211,959, describes an electric lamp control module which makes it possible to turn it on or off by touching a metallic shaft. "SIEMENS" manufactures and sells an electronic module under the reference "CMOS DIMMER SLB0586" which comprises a static interrupter switch, an electronic power dimmer and an electronic control circuit of these components; this circuit is provided with a detection input connected to a metallic bonding pad forming a tactile sensor so as to deliver control pulses which are a function of the currents which are caused on the said input detection when an operator touches the metallic bonding pad; these impulses are configured by the control circuit in a manner so as to open or close the static switch in case of brief contact on the metallic bonding pad, or to control a cyclic variation of the power at the output of the dimmer in case of prolonged contact. Such a control module is formed by the manufacturer to be utilized in particular in the home automation field so as to replace wall switches, and to make it possible to turn on or off a lighting element, and to adjust the brightness thereof without any element undergoing mechanical displacement. The control module is generally imbedded in the wall or applied to it (in place of the electromechanical switch) in a manner such that its metallic bonding pad is apparent; the power system of the lighting element remains otherwise traditional; it requires, in particular, the positioning of power conductors connecting the lighting element, the control module whose metallic bonding pad serves as a contactor, and the electrical feed network.

Furthermore, this type of module is used in French Utility Certificate 2,574,157 to a mood lamp having a metallic base, the latter playing the role of a tactile sensor in order to create leakage currents when the operator touches it. However, this use remains very limited because few lamps have a metallic base adapted for this application. To overcome this limitation, U.S. Pat. 4,507,716 and German Patent 2,641,105 envision coating an insulating lamp base so as to render it conductive, or to equip it with a conductive sheet or conductive electrodes, the control module having a sensitive input which is electrically connected to these conductive elements. However, these transformations which the lamps must undergo are costly and modify the appearance thereof, and are not possible for old lamps.

SUMMARY OF THE INVENTION

The object of the present invention is to apply in a novel fashion the control modules of the type mentioned above so as to form feed systems of novel design, adapted to lead, particularly in the field of home automation, to considerable advantages, particularly a notable simplification of the power lines, to a reduction of the technical constraints, and to important savings on installation costs (reduction and even elimination of grooves, moldings, wiring ducts, . . . ). Another objective of the invention is to increase considerably the possibilities of application of such modules, in particular application to lamps having an insulating base, various applications in home automation, certain industrial applications, application for the control of certain electronic equipment.

The process of the invention for manufacturing a feed system for at least one electric unit allowing for a touch control thereof is of the type in which one connects the said electric unit to an electric power source by means of a power line, one interposes a static switch on the said power line in a manner so as to be able to open or close it, and one controls the said static switch by means of an electronic circuit provided with a detection input, this electronic circuit being adapted to cause switching of the said static switch as a function of the low intensity leakage currents appearing at its detection input; according to the process of the present invention, one connects the detection input of the electronic control circuit to a support made out of a material of electrically insulating nature, and one subjects the said support to a chemical treatment in a manner so as to reduce the electrical impedance of one of its zones beneath a threshold adapted such that the said zone is capable of conducting the leakage currents, the said chemical treatment of the support being carried out in a manner such that the reduced impedance zone is insulated on the electrical plane, that it is placed into electrical contact with the detection input of the electronic circuit and that it has a portion accessible to the touch, in a manner so as to allow for the appearance of leakage currents during touching of the said portion by an operator.

By "operator", it is meant a human being as well as an electrical equipment of some sort adapted to be displaced to come into contact with the accessible portion of the treated zone. In home automation or applications related to lamps and light fittings which are more particularly described below, the operator will generally be a person touching with his finger the accessible portion of the treated zone; in certain industrial applications (end of extent apparatus for example), the operator can be a spur positioned on a movable unit to come into contact with this treated zone.

According to a preferred characteristic of the invention, one interposes in series on the detection input of the electronic control circuit, means for measuring the variations of the leakage current $\Delta i / \Delta t$ and to inhibit the said leakage current in case of variations less than a predetermined threshold.

One thus suppresses the appearance of parasitic leakage currents, due for example to climactic variations (temperature, humidity), which could accidentally set off the control of the electric unit: these parasitic leakage currents present in effect slow variations and are inhibited by the above means.

According to another preferred characteristic of the invention, one polarizes the one or more reduced impedance zones by connecting them to the electric power source across a resistance bridge ($R_1$, $R_2$) and a diode bridge ($D_1$) in a manner such that the one or more zones is permanently referenced to the phase of the electrical supply. The installation can thus be plugged into the electrical power supply (electrical power network or other) without being preoccupied with the direction of connection phase/neutral.

At the static switch interposed on the power line, it is possible to associate an electronic power dimmer; the electronic control circuit is thus adapted to control the said dimmer as a function of the leakage currents appearing at its detection input so as to allow for variations of intensity of the feed current of the electric unit. In particular, it is possible to utilize an electronic circuit of the type "CMOS DIMMER SLB0586" manufactured by the "SIEMENS" firm adapted to deliver towards the static switch and the power dimmer control pulses which are a function of the leakage currents. In this circuit, the switching and dimming functions are assured by a Triac whose gate receives control pulses created by an integrated circuit. It is thus possible not only to obtain a turning on and turning off of the electric unit, but further to vary the feed power thereto. One can thus, by touching it, adjust the intensity of lighting of a lamp or the speed of rotation of a motor. In this type of circuit, the cyclic variation of power is obtained by an extended contact on the accessible portion of the treated zone, the operator stopping the contact when the power reaches the desired value; the closure or the opening of the power line is obtained by a rapid contact.

According to one preferred embodiment, one chemically treats the support in a manner such that the electrical impedance of the zone positioned between the accessible portion and the detection input has a value less than a threshold on the order of 20 megaohms and preferably on the order of 5 megaohms. In particular, a value included between 0.1 and 5 megaohms gives good results in most of the applications (absence of spurious release; sure and reproductive control during touching, producing leakage currents sufficient to be detected by the electronic circuit and to engender the generation of control pulses of the static switch or of the dimmer).

Preferably, one equips the electronic control circuit with a resistive bridge composed of resistors, connected between the detection input and the electric source; in each application, the resistance values of this bridge can thus be adjusted as a function of the impedance between the accessible portion and the detection input, in order to optimize the appearance of the leakage currents.

According to the application, the support of an insulating nature is constituted by a base, possibly a lamp shade, a wall, a partition or a ceiling home automation or by any other insulating element (touch keys, . . .); this support can be made out of an insulating material of a very diverse type and in particular of wood, ceramic, stoneware, porcelain, sandstone, plastic material, glass, granite, marble, plaster, cement, concrete, baked clay, paper, fabric, leather, rubber, paint, synthetic foam or of a derivative of these materials. In one preferred mode of application, the support is treated by means of an ionic solution, in particular acid solution or saturated saline solution; one will preferably utilize an iron perchloride, hydrochloric acid, or a chloride-base aqueous solution. Tests have made it possible to observe that the impregnation of the zone of the support to be treated by means of said solutions during durations as a function of the nature of the support make it possible to reduce the impedance of this zone to confer to it a satisfactory value in the ranges of values elicited above, and this, in a permanent manner.

The process of the invention can in particular be applied to form a touch controllable lamp, comprising a hollow base made out of a material of an electrically insulating nature and a lighting element carried by the said base; in this application:

the wall of the hollow base is treated chemically to reduce the impedance thereof over the entire surface with the exception of the lower portion adapted to serve as a footing, the electronic circuit, the static switch and if necessary the power dimmer are secured within the base, the detection input being electrically connected to the interior surface thereof at the level of the treated zone.

According to an alternative, it is the lampshade which is made out of insulating material (fabric, cardboard, plastic material) which is chemically treated to allow the control. In this case, the detection input is connected to the treated zone of the lampshade, for example by a conductive wire carried within the lampshade by the support of the latter.

The process of the invention can likewise be applied to achieve in a building power supply of at least one electric unit, in particular a bulb, strip light or electric outlet; in this application:

one connects the electric unit to the network by a power line at least in part carried by one or more walls of the building, which are formed out of a material of an electrically insulating nature, the electronic circuit, the static switch and in the occurrence the dimmer module being associated with the said power line, one subjects the one or more walls to a chemical treatment along at least one continuous strip to form the reduced impedance zone, the said chemical treatment being carried such that the said strip has a portion close to the electronic circuit and a portion accessible to the touch, one electrically connects the portion close to the electronic circuit to the detection input of the circuit, one forms a marking of the portion accessible to the touch so as to allow for referencing.

Such a system can likewise serve to feed certain motors utilized in home automation (motors of rolling shades, motors of fans, . . . ).

In such a system, the power lines can remain inaccessible (lines lodged between floor and ceiling, or between partitions, . . . ): these lines without any surface extension (at least extensions of significant length) are easy to position in a traditional manner without it being necessary to provide grooves, moldings. . . on the wall surfaces; the controls occur in the absence of electric wires (at least of significant length) by virtue of treated strips of reduced impedance, which are formed directly on the walls of the building in a manner so as to connect the detection input of the electronic circuit and the portion accessible to the touch. These strips obtained by simple impregnation are invisible after drying and impose no particular technical drawback, the accessible portion being simply indicated such that the user can touch it with the finger. It is appropriate to note that this portion includes no attached element, such as a contactor or metallic bonding pad which is imbedded or projecting.

Of course, a plurality of electric elements can be controlled from several portions accessible by virtue of a network of continuous treated strips having a reduced impedance, the said network connecting the accessible portions and the electronic circuits associated with diverse electric units to be controlled according to an arrangement which is a function of the desired control plane.

The process of the invention can likewise be applied for the control of certain electronic materials, for example keys made of insulating material of computer keys, telecopier keys, telephone keys, typewriter keys . . . The keys or portions thereof (which are then affixed in the absence of any movable switch) are treated to lower their impedance and are connected to the detection inputs of the electronic control circuits; this linkage can occur through a conductor or by chemical treatment of zones of the support means which carry the said keys, so as to lower the impedance thereof.

The invention extends to the installations formed by embodying the process defined above: home automation system for feeding electric units in a building, lamp and light fitting system having fixed keys for the control of electronic equipment or others . . .

BRIEF DESCRIPTION OF THE DRAWINGS

The invention disclosed above in its general form will be better understood upon reading the description which follows and upon examining the annexed drawings which present byway of non-limiting example embodiments thereof; in these drawings:

FIG. 2 is a schematic view in detail of a circuit,

FIG. 3 partially schematically illustrates a treated strip and its accessible portion, FIG. 4 illustrates the treatment operation of this strip, FIGS. 5 and 6 are are block diagrams of electronic units which are used to equip the circuit, FIG. 7 is a schematic view in axial cross section of a lamp according to the invention, FIG. 8 is a detailed view of the said lamp on a larger scale, and FIG. 9 illustrates the treatment operation of the base of the said lamp.

DETAILED DESCRIPTION OF THE PREFERRED EMBODIMENTS

Figure 1:
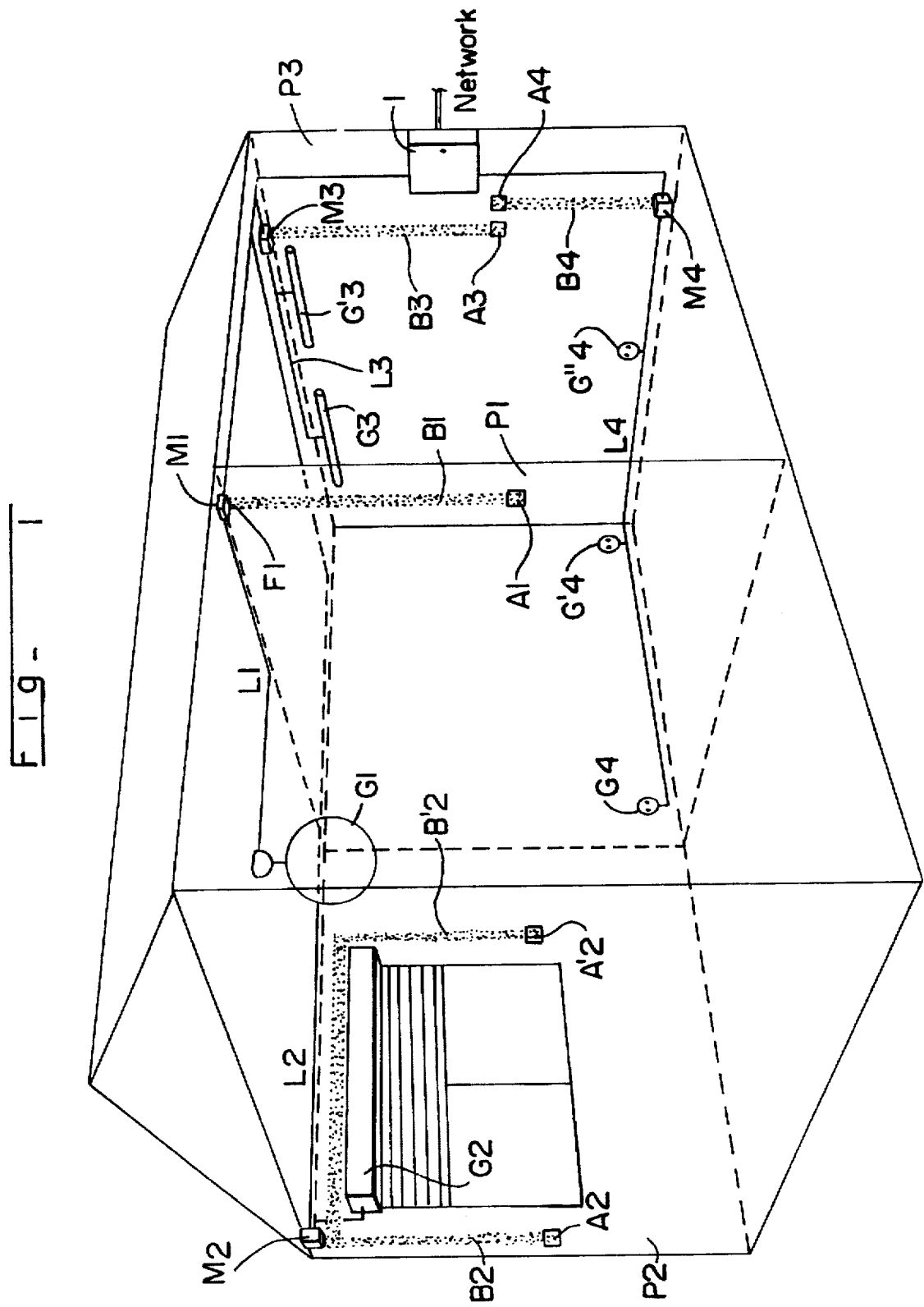
FIG. 1 is a schematic view in perspective of a system according to the invention, arranged in a home to feed various electrical units thereof.

The electronic feed system schematically illustrated in FIG. 1 comprises electrical power lines such as $L_1$, $L_2$, $L_3$, $L_4$ which are connected to the France Electric (E.D.F.) power network across normal equipment located in a box 1 (circuit breakers, meters, . . .). These lines feed various electric units within the home, in the example a lightbulb $G_1$ housed in a globe, a motor $G_2$ of a rolling shade, strip lights $G_3$ and $G'_3$ positioned in parallel and outlets $G_4$, $G'_4$, $G''_4$ position in parallel.

The power lines $L_1$ . . . $L_4$ are arranged so as to connect the units that they feed, by the shortest and most practical path without utilizing command switches. For example, the line $L_1$ is first applied vertically to the rear of a wall (in particular in the space provided for this purpose in the current construction processes), then runs above a false ceiling. The power line passes in the vicinity of a wall $P_1$ acting as a plaster partition (pre-fabricated elements or wall formed of construction materials whose surface is plastered); in this portion, the line $L_1$ is equipped with an electronic module $M_1$ of the type "CMOS DIMMER SLB0586" sold by "SIEMENS". In an analog manner, the line $L_2$ is equipped with an analogous module $M_2$ in the vicinity of the wall $P_2$ that one can assume to be coated with a wallpaper; the line $L_3$ is equipped with a module $M_3$ adjacent to wall $P_3$ assumed to be covered with brick facing; line $L_4$ is equipped with a module $M_4$ positioned at the base of the wall $P_3$.

The line $L_1$ and its module $M_1$ are symbolically shown in FIG. 2. The module comprises:

a printed circuit $C_i$ essentially composed, on the one hand, of a Triac associated with an electronic power so as to act as a static switch and dimmer, on the other hand, an electronic control circuit in order to assure the control of the Triac, a circuit $H_i$ for measuring and inhibiting leakage current, connected to the detection input of the circuit $C_i$ in order to measure the leakage current variations $\Delta i/\Delta t$ and to inhibit the leakage current in case of variations beneath a predetermined threshold, a polarization circuit $PO_i$ for continuously feeding the measurement circuit $H_i$ and polarizing the treated zones of reduced impedance, finally a resistance bridge symbolically shown by resistances $R_1$ and $R_2$, connected on the measurement circuit $H_i$ and on the polarization circuit $PO_i$ as schematically shown in FIG. 2.

The resistances $R_1$ and $R_2$ of the bridge are adjusted to a value close to $10\times10^6$ ohms for the resistor $R_1$ and $0.3\times 10^6$–$0.8\times10^6$ ohms for resistor $R_2$.

The detection input $E_d$ is connected across measurement circuit $H_i$ and the resistance bridge $R_i$ to the surface of the wall $P_i$ by means of an attachment element driven into the upper portion F of this wall adjacent to the module $M_1$. This attachment element comprises a metallic head to allow for the passage of leakage currents.

The wall $P_1$ is treated along a continuous strip $B_1$ having a width of one to several centimeters. This strip extends from the portion F close to module $M_1$ up to a lower portion $A_1$ accessible by the users.

The treatment of the zone $B_1$ of the wall can be achieved by impregnation by means of an application instrument T such as schematically shown in FIG. 4 (or possibly by means of a paintbrush).

This impregnation is achieved by spreading over the width of the strip $B_1$ an ionic solution, in particular an aqueous iron perchloride aqueous solution, of a density on the order of 1.3. The impregnation occurs over several applications; after drying, the impedance between the portion F and the portion $A_1$ is measured and one observes that its impedance is no longer infinite (as was the case for the initial plaster partition) but is lowered; the ionic treatment of the strip $B_1$ (number of impregnations) is achieved until reaching after drying an impedance having a value between 0.1 and 5 megaohms between the two above-mentioned portions.

Furthermore, the accessible portion $A_1$ is marked by any means so as to make it possible to locate it (after drying the strip $B_1$ is no longer visible). For example, a border can be drawn or glued around this portion $A_1$.

The other feed lines $L_2$ . . . are treated in an analogous manner such that the walls concerned $P_2$ . . . are provided with continuous strips $B_2$ . . . of reduced impedance connecting the detection inputs of the concerned circuits to accessible portions $A_2$ . . . which are referenced on the concerned walls.

It is possible, as is the case of module $M_2$ which is associated to the feed line $L_2$ of the rolling shade $G_2$, to treat two (or more) continuous strips $B_2$, $B'_2$ which are connected in a manner so as to have a common portion close to module $M_2$, a common portion to which is connected the detection input of the said module. Each continuous strip $B_2$, $B'_2$ has a referenced accessible portion $A_2$, $A'_2$: it is thus possible to control the electric element concerned from several portions situated at different locations. If necessary, the treated continuous strip can have an accessible portion of substantial length (extending in particular in the horizontal direction) in order to allow for a touch control at any point of this portion, this accessible portion being of course referenced over its length by any appropriate means.

Several elements in parallel can be controlled simultaneously from a single accessible portion, as is the case for the strip lights $G_3$ and $G'_3$ which are powered by line $L_3$ and controlled from portion $A_3$ of the treated strip $B_3$ which is connected to the detection input module $M_3$. The arrangement is analogous for outlets $G_4$, $G'_4$ and $G''_4$.

Various configurations of the continuous strips can be combined to obtain a desired control plane; the one or more walls of the building are then treated along a network of continuous strips which are connected to the detection inputs of an electronic module assembly and which have accessible portions positioned along the control plane desired.

The touch of an accessible portion by a user causes the appearance of leakage currents of very low intensity along the one or more continuous strips which are connected to this accessible portion and over the one or more detection inputs of the associated electronic circuits; these currents are translated into the one or more circuits by control pulses of the one or more Triacs which cause an opening or closing of the one or more power lines concerned or a variation of the transmitted power.

The measurement circuit $H_i$ serves to avoid that small variations of the leakage current are taken into account, in particular slow variations due to climactic modifications (humidity, temperature). These slow modifications by their nature cause variations of leakage current which spread out over several minutes and the measurement circuit $H_i$ inhibits them. The variation threshold $\Delta i/\Delta t$ beyond which the leakage current is validated can be on the order of $10^{-6}$ amperes per second: one is thus assured that a signal (representative of the appearance of a sufficient leakage current) is created on the detection input of circuit $C_i$ only in the case of voluntary action on the portion $A_1$.

An embodiment of the measurement circuit $H_i$ is shown in FIG. 5. The feed of this circuit (not shown in this Figure) is formed continuously by the polarization circuit $PO_i$ (whose example is described below with reference to FIG. 6).

The resistance bridge ($R_1$, $R_2$) translates the leakage current into a voltage signal which is sampled by an impedance adaptor 11 of classical type. At the outlet of adaptor 11, the voltage image of the leakage current is treated by a high pass filter 12 which suppresses the continuous component so as to center the signal.

The signal is then memorized by a sampler blocker 13; the control unit 13c of this sampler delivers a control pulse to the frequency of the network so as to achieve the memorization at this frequency. The signal image of the leakage current is a monoalternating signal (by virtue of the polarization achieved by the circuit $PO_i$) and the maximum value of the signal is thus memorized by the blocking sampler (in itself of conventional structure). The signal from the sampler 13 is treated by a low pass filter 14 which suppresses the high parasitic frequencies and by an amplifier 15 which adjusts the maximum amplitude of it.

The signal thus treated is delivered to the input of a differentiator 16 which calculates the derivative thereof and furnishes at the output an image signal of the variation of the leakage current to the network frequency. This signal is compared in a comparator 17 to a reference signal generated by a reference generator 18, so as to deliver at the output a logic signal which is a function of the position of the input signal with respect to the reference signal: the signal from comparator 17 pilots an output stage 19 constituted by an optocoupler which delivers towards the detection input of circuit $C_i$ a null signal in the case of $\Delta i/\Delta t$ less than a threshold ($10^{-6}$ amperes per second, for example) or a positive signal adapted to release the circuit $C_i$ in the contrary case.

FIG. 6 illustrates an embodiment of the polarization circuit $PO_i$. This circuit makes possible, on the one hand, to polarize across the resistance bridge $R_1$, $R_2$ the reduced impedance zone $B_1$ so as to reference it with respect to the phase of the sector and to thus generate monoalternating leakage currents, on the other hand, to feed the measurement circuit $H_i$ with a continuous voltage, floating with respect to the network and referenced with respect to the leakage currents.

To this end, the circuit $PO_i$ which is connected to the network comprises a diode bridge $D_1$ whose output + is connected to the zone $B_1$ across the resistance bridge $R_1$, $R_2$. Furthermore, a transformer $T_1$ has a primary winding connected to the electric network and two secondary windings connected to conventional regulation modules RD so as to generate three levels of continuous voltage −12 V, 0 and +12 V to feed the measurement circuit $H_i$. The level of positive voltage is referenced at the output of the diode bridge by an electric connection.

The process of the invention has numerous advantages with respect to traditional electrical feed process: great flexibility to achieve complex installations with a minimum of equipment, limitation of technical drawbacks such as grooves, moldings . . . ., substantial simplification of the layout of the power lines, easiness to modify the control network without destruction of the walls . . .

FIGS. 7 and 8 illustrate an embodiment of the process of the invention in the case of a lamp.

This lamp comprises a base S made of a traditional insulating material in the electrical plane, for example porcelain. This base S is treated by means of an ionic solution so as to reduce the impedance thereof over the entire surface $S_h$ with the exception of the base $S_b$.

This treatment can be performed as schematically shown in FIG. 9 by inverting the base, by blocking its collar and by pouring the ionic solution up to the limit of its base Sb. In the example, the solution can be an aqueous solution of iron perchloride having a density of approximately 1.3. The solution can be left approximately one hour in the base. After drying, it is observed that the material has a non-infinite impedance at the level of the zone $S_h$; a measurement by means of an electrode in contact with the internal surface of the base (zone $S_h$) and another electrode positioned at 3 cm from the first in contact with the external surface of the base (still at the level of the treated zone $S_h$) gives an impedance on the order of $10^6$ ohms for a Limoges porcelain (manufacturer "Ceradel-KPCL", reference: "TM10").

The base thus treated is equipped in a conventional manner, with a socket device 3 at the level of its collar to support and feed a bulb 4. An electric feed cable 5 provided with an outlet plug 6 extends through the base and is connected to the socket device 3. This cable carries an electronic module $M_5$ (of the same type as the modules $M_1$ . . . $M_4$) interposed on cable 5: the detection input $E'_d$ of this module $M_5$ is connected to the internal surface of the base at the level of the upper treated zone $S_h$, by means of spring shafts 7, 8 made of metallic material (for example in a number of three at 120 degrees). The module $M_5$ can be affixed on these shafts with its detection input $E'_d$ welded thereon. Shafts 7 and 8 are arranged to come into contact with the internal surface of the base (treated zone $S_h$) through a non-point zone.

In the example described, the resistors are $R_1$ and $R_2$ of the resistance bridge of the module $M_5$ can be adjusted to the following values: $R_1=10\times10^6$ ohms; $R_2=0.5\times10^6$ ohms.

Furthermore, in the example, a layer 9 made of electrically insulating material (for example foam of synthetic material) is glued to the base of the base to close it and improve the quality of electrical insulation of the base which serves as a footing.

The lamp can be completed in a conventional manner with a lampshade 10 supported by the socket device 3.

When an operator touches the external surface of the base at the level of the treated zone $S_h$ (that is to say at the level of the entire surface with the exception of the base portion $S_b$), he creates leakage currents of very small intensity across the wall of the base, the shafts 7 and 8 and the detection input of the module $M_5$. As previously, these leakage currents are translated by the electronic circuit of the module in the form of control pulses which generate an electric opening or closing on cable 5, or a variation of the power transmitted.

Furthermore, treatment tests have been performed with different types of electrically insulating material, in order to reduce the impedance thereof and to render them able to conduct leakage currents capable of releasing the above-noted electronic modules. These tests have consisted of obtaining in these materials strip-shaped test pieces, to measure the impedance on the one hand between two points of the same surface spaced by 3.6 centimeters ($Z_1$), on the other hand, between two points facing two surfaces ($Z_2$), to treat the test pieces by means of ionic solutions $I_1$, $I_2$ placed into contact with a surface during a time T and to measure again the impedance between the points $Z'_1$, $Z'_2$.

The solution $I_1$ is constituted by pure hydrochloric acid. The solution $I_2$ is constituted by an aqueous iron perchloride solution (density: 1.33).

Tests of operation of an electronic module "SIEMENS CMOS DIMMER SLB0586" have been conducted with non-treated test pieces and treated test pieces. In all cases, the impedances $Z_1$ and $Z_2$ of the non-treated test pieces are too elevated to allow for the passage of sufficient leakage currents sufficient to set off the module; on the other hand, with the treated test piece, one obtains a reproducible operation of the module (the resistances $R_1$ and $R_2$ of the resistance bridge of the module have the following values in these tests: $R_1=20.2\times10^6$ ohms; $R_2=0.47\times10^6$ ohms).

The table below summarizes the results obtained.

| Type of test piece | Thickness | $Z_1$ ohms | $Z_2$ ohms | Ionic solution used | Duration T of the treatment | $Z'_1$ ohms | $Z'_2$ ohms |
|---|---|---|---|---|---|---|---|
| stoneware | 10 mm | $226\times10^6$ | $45\times10^6$ | $1_1$ | 20 minutes | $1.2\times10^6$ | $10^6$ |
| stoneware | 10 mm | $226\times10^6$ | $45\times10^6$ | $1_2$ | 20 minutes | $10^6$ | $10^6$ |
| enamelled stoneware on the surface | 10 mm | $226\times10^6$ (non enamelled surface) | $45\times10^6$ | $1_2$ | 20 minutes | $10^6$ (non enamelled surface) | $6\times10^6$ |
| double thickness glass treatment between the thicknesses | 6 mm | $555\times10^6$ | $85\times10^6$ | $1_2$ | — | $6.3\times10^6$ | $5\times10^6$ |
| wood (cottonwood) | 8 mm | $49\times10^6$ | $46\times10^6$ | $1_2$ | 60 minutes | — | $13\times10^6$ |
| plaster | 35 mm | $19\times10^6$ | $21\times10^6$ | $1_2$ brush one layer | — | $1.2\times10^6$ | $10.7\times10^6$ |
| porcelain | 10 mm | $222\times10^6$ | $58\times10^6$ | $1_2$ | 20 minutes | $10\times^6$ | $10^6$ |
| wallpaper or plaster | — | $19\times10^6$ dimensions of wallpaper | — | $1_2$ brush one layer | — | $0.29\times10^6$ | — |

What is claimed is:

1. A process for providing a system that feeds at least one electric unit controllable by touch, comprising:

connecting the at least one electric unit to an electrical source through a power line;

coupling a static switch in the power line to be selectably open or closed;

controlling the static switch with an electronic circuit having a detection input, the electronic circuit generating control pulses of the static switch as a function of leakage currents of low intensity detected at the detection input;

coupling the detection input to a support comprising an electrically insulating material and including at least one zone;

chemically treating the support to reduce an electrical impedance of the at least one zone to below a predetermined level to conduct the leakage currents;

electrically coupling the detection input to the at least one zone;

providing the at least one zone with an access portion to be touched by a user to generate the leakage currents; and operating the at least one electric unit in accordance with the leakage currents occurring at the detection input.

2. The process according to claim 1, locating in series with the detection input a device for measuring variations of the leakage current $\Delta i/\Delta t$; and inhibiting the leakage current when the measured variations are less than a predetermined threshold.

3. The process according to claim 1, polarizing the at least one zone by coupling each at least one zone to the electric source through a resistance bridge and across a diode bridge.

11

4. The process according to claim 1, coupling an electronic power dimmer to the static switch; and controlling the electronic power dimmer in accordance with the leakage currents detected at the detection input.

5. The process according to claim 4, the electronic control circuit comprising a CMOS circuit that delivers control pulses as a function of the leakage currents.

6. The process according to claim 1, the electrical impedance of the at least one zone having a value less than 20 megohms.

7. The process according to claim 6, the electrical impedance of the at least one zone having a value of approximately 5 megohms.

8. The process according to claim 1, coupling a resistance bridge, comprising a plurality of resistance elements, between the detection input and the electric source; and adjusting the value of the resistances elements as a function of the electrical impedance of the at least one zone.

9. The process according to claim 1, chemically treating the support with one of an ionic solution.

10. The process according to claim 9, the ionic solution comprising one of an acid solution, a saturated saline solution, an iron perchloride, a hydrochloric acid, and a chloride-base aqueous solution.

11. The process according to claim 1 producing a lamp controllable by touch, the support comprising a hollow base for the lamp;

chemically treating an entire interior wall of the hollow base, except a bottom portion, to form a treatment zone having a reduced impedance;

connecting the electronic circuit and the static switch to the hollow base; and electrically coupling the detection input to the treatment zone.

12. The process according to claim 11, the chemically treating of the hollow base comprising:

inverting the hollow base;

positioning, for a predetermined period, the hollow base in a bath of ionic solution to a level to form the treatment zone.

13. The process according to claim 1 feeding at least one electrical unit in a building, the support comprising at least one wall of the building;

positioning the power line on an interior surface of said at least one wall;

chemically treating the at least one wall to form a treatment zone having a reduced impedance;

positioning the electronic control circuit adjacent the treatment zone; and electrically connecting the detection input to the treatment zone.

14. The process according to claim 13, further comprising:

controlling the at least one electrical unit from a plurality of locations within the building;

the controlling from a plurality of locations comprising chemically treating at least one wall with at least one of treatment zone to form a plurality of treatment zones in the building;

forming each of the plurality of treatment zones so that an end of each of the plurality of treatment zones is positioned adjacent the electronic control circuit; and electrically coupling each of the plurality of treatment zones to the detection input.

12

15. The process according to claim 13, further comprising:

chemically treating the walls with an ionic solution to form the treatment zone.

16. The process according to claim 1, the support comprising a material including at least one of wood, ceramic, stoneware, porcelain, sandstone, plastic, glass, granite, marble, plaster, cement, concrete, baked clay, paper, fabric, leather, rubber, paint, and synthetic foam.

17. A feed system for at least one electric unit, comprising:

a power line connecting the at least one electric unit to an electric power source;

a module comprising a static switch coupled to the power line and to be selectably open or closed and an electronic control circuit, coupled to the static switch and having a detection input;

the electronic control circuit generating control pulses of the static switch as a function of leakage currents of low intensity detected at the detection input;

a support, comprising an electrically insulating material, coupled to the detection input;

at least one zone formed in the support by chemical treatment to reduce an impedance of the zone to conduct leakage currents;

the at least one zone being electrically coupled to the detection input and including an access portion to be touched by a user to generate the leakage currents;

the electronic control circuit operating the at least one electric unit in accordance with the leakage currents generated.

18. Feed system according to claim 17, characterized in that it comprises, arranged in series on the detection input of the electronic control circuit, or measurement device for measuring the variations of the leakage current $\Delta i/\Delta t$ and inhibiting the said leakage current in the case of variations less than a predetermined threshold.

19. Feed system according to claim 18, characterized in that the measurement device comprise a sampler blocker ($13_c$) and its control unit ($13_c$) in order to memorize the leakage current at the frequency of the electric power source, a differentiator receiving the signal from the sampler blocker and delivering at the frequency of the electric source an image signal of the variation of the leakage current, and a comparator receiving the signal from the differentiator and a reference signal so as to deliver an inhibiting or validating signal depending upon the spacing between the signals received.

20. Feed system according to claim 18, characterized in that it comprises polarization means connected to the electric power source and comprising a diode bridge for the polarization of the reduced impedance zones and a transformer having two secondary windings for the feeding of the measurement device.

21. Feed system according to claim 17, in which the module comprises and electronic power dimmer interposed on the power line, electronic control circuit being adapted to control the said dimmer as a function of the leakage currents appearing at its detection input.

22. Feed system according to claim 17 characterized in that the reduced impedance zone of the support has between its accessible portion and the detection input an impedance with a value less than 20 megohms and preferably between 0.1 and 5 megohms.

23. Feed system according to claim 17, characterized in that the electronic control circuit is equipped with a resistance bridge of adaptable resistors connected between the detection input and the output connected to the electric source.

24. The feed system according to claim 21, the electronic control circuit comprising a CMOS module.

25. A lamp controllable by touch comprising:
- a hollow base comprising an electrically insulating material, the electrically insulating material being chemically treated to form a treated zone in which an impedance over an entire interior surface except a bottom portion is reduced;
- a lighting element carried by the hollow base;
- an electrical feed cable to couple the lighting element to an electrical outlet;
- a module comprising a static switch and a power dimmer coupled to the lighting element, and an electronic control circuit, comprising a detection input, controlling the static switch and power dimmer as a function of leakage currents detected at the detection input;
- the module being electrically coupled to the treated zone;
- the detection input coupled to a leakage current variation detector that inhibits detection of leakage currents at the detection input when a leakage current variation is below a predetermined threshold.

26. A home automation system for feeding at least one electrical unit comprising:
- an electric feed line, coupled to the at least one electrical unit, carried by one or more walls of a building;
- each of the one or more walls of the building comprising an insulating material;
- at least one module comprising a switch and a power dimmer coupled to the at least one electrical unit, and an electrical control circuit, comprising a detection input, controlling the switch and power dimmer as a function of leakage currents detected at the detection input;
- at least one of the one or more walls of the building being chemically treated to form a treated strip having a reduced impedance to conduct the leakage currents;
- the treated strip comprising a portion adjacent the electronic circuit and electrically coupled to the detection input;
- the portion, to be touched by a user, generating the leakage currents;
- a leakage current variation detector, coupled between the portion and the detection input, detecting variations in the leakage current and inhibiting the detection of leakage current at the detection input when the leakage current variation is below a predetermined threshold.

* * * * *